United States Patent [19]

Cheung

[11] Patent Number: 5,411,772
[45] Date of Patent: May 2, 1995

[54] METHOD OF LASER ABLATION FOR UNIFORM THIN FILM DEPOSITION

[75] Inventor: Jeffrey T. Cheung, Thousand Oaks, Calif.

[73] Assignee: Rockwell International Corporation, Seal Beach, Calif.

[21] Appl. No.: 187,424

[22] Filed: Jan. 25, 1994

[51] Int. Cl.$^6$ .............................................. B05D 3/06
[52] U.S. Cl. .................................. 427/586; 427/596; 427/561
[58] Field of Search ............... 427/561, 586, 596, 597; 219/121.82, 121.85

[56] References Cited

U.S. PATENT DOCUMENTS

| | | | |
|---|---|---|---|
| 4,537,791 | 8/1985 | Tajan | 427/596 |
| 4,701,592 | 10/1987 | Cheung | 219/121 LT |
| 4,740,386 | 4/1988 | Cheung | 427/53.1 |
| 4,892,751 | 1/1990 | Miyake et al. | 427/586 |
| 4,987,007 | 1/1991 | Wagal et al. | 427/53.1 |
| 5,015,492 | 5/1991 | Venkatesan et al. | 427/596 |
| 5,017,277 | 5/1991 | Yoshida et al. | 427/596 |
| 5,019,552 | 5/1991 | Balooch et al. | 427/596 |
| 5,049,405 | 9/1991 | Cheung | 427/53.1 |
| 5,084,300 | 1/1992 | Zander et al. | 427/596 |
| 5,098,737 | 3/1992 | Collins et al. | 427/53.1 |
| 5,158,931 | 10/1992 | Noda et al. | 427/596 |
| 5,212,148 | 5/1993 | Roas et al. | 427/596 |

FOREIGN PATENT DOCUMENTS

| | | | |
|---|---|---|---|
| 4008266 | 1/1989 | Japan | 427/596 |
| 4047857 | 2/1989 | Japan | 427/586 |

OTHER PUBLICATIONS

Chrisey et al, ed, *Pulsed Laser Deposition of Thin films,* excupts John Wiley & Sons, Inc. N.Y. 1994 (no month).

*Primary Examiner*—Marianne Padgett
*Attorney, Agent, or Firm*—John C. McFarren

[57] ABSTRACT

A method is provided for depositing a uniform thin film on a substrate using laser ablation of a target material in a deposition chamber. The laser beam may be pulsed and focused to strike the target along a line to produce a broad plume of ablated material expanding in a propagation direction outward from the target. The plane of the substrate deposition surface is oriented generally parallel to the propagation direction of the plume of ablated material. The deposition chamber includes a low background pressure of inert or reactive gas to facilitate lateral diffusion of ablated atoms, ions, and molecules to be deposited on the substrate surface. Particles ejected from the target material, which have trajectories generally parallel to the propagation direction of the plume, are too heavy to have significant lateral diffusion and have little chance of lodging on the deposition surface. The substrate may be rotated about an axis perpendicular to the deposition surface (and generally perpendicular to the propagation direction of the plume) to provide uniform deposition over the entire surface. The method may also be used to deposit thin films on both sides of a substrate simultaneously, and on multiple substrates by stacking them in the plume in space-apart orientation.

20 Claims, 2 Drawing Sheets

METHOD OF LASER ABLATION FOR UNIFORM THIN FILM DEPOSITION

TECHNICAL FIELD

The present invention relates to thin film deposition using laser ablation and, in particular, to a method of orienting a substrate in a plume of laser ablated material to deposit a uniform thin film on the substrate.

BACKGROUND OF THE INVENTION

Laser ablation of a target of source material is a known technique that is useful in the field of thin film deposition on a substrate. Typically, a pulsed laser beam is employed to produce a plume of ablated material in a process known as Pulsed Laser Deposition, or PLD.

Many different materials, such as simple oxides, ferroelectrics, and high $T_c$ superconductors, for example, have been deposited by pulsed laser deposition. Compared with traditional technologies such as electron beam deposition, chemical vapor deposition (CVD), and various sputtering techniques, for example, PLD generally allows better control over stoichiometry of the deposited material, provides capability for a more reactive environment, and produces evaporants with desired energies for improved film crystallinity. Secondary advantages of PLD include small target size (typically ½ inch in diameter), ability to grow multilayer heterostructures, introduction of dopants by plasma interaction, and the absence of inert sputtering gas. Despite these advantages, however, PLD has remained primarily a research tool. The evolution of PLD into a production compatible process has been hampered by two major problems: the lack of large area uniformity, and the rough surface morphology that results from particle inclusion.

The ablation plume produced by PLD is a result of adiabatic jet expansion, which is not Lambertian (i.e., not a $\cos \Theta$ distribution). The angular distribution of PLD ablation plumes follows a $\cos^n \Theta$ law, where n can vary from about 2 to 11. This narrow angular distribution and the close target-to-substrate distance results in poor thickness uniformity of the deposited film. The best known data on large area uniformity that has been reported was obtained using off-center substrate rotation to achieve a 10% variation over a one inch square area. Other techniques include rastering the laser beam over a large area target or using an aperture to skim the ablation plume while moving the substrate in the x-y direction.

In addition to nonuniformity, the inclusion of particles in a thin film degrades the quality of the film and the performance of the end device. For example, particle inclusion causes light scattering in optical applications and can cause electrical shorts in ferroelectric thin film memory devices. The poor surface morphology produced by laser deposition is a problem associated with the intense interaction between laser and target, which causes splashing from mechanisms such as exfoliation, subsurface boiling, and repulsion of the surface molten layer by recoil pressure of the expanding ablative plasma. With the exception of a few materials, such as yttria stabilized zirconia (YSZ), $SrTiO_3$, MgO, $La_{0.5}Sr_{0.5}CoO_3$, and a few other materials, nearly all laser ablated materials suffer from this problem. Some materials, such as Ge, produce "particle-free" films if a molten target is used. Other techniques include the use of a mechanical velocity filter, synchronous pulses from a second laser, synchronous pulsed oxygen nozzle beams, and careful preparation of the target surface. All of these techniques, however, are only marginally successful in improving surface morphology of the deposited films. If pulsed laser deposition is to be successful in transitioning from the laboratory to large scale fabrication operations, techniques must be developed to eliminate particle inclusion and provide large area uniformity of the deposited film.

SUMMARY OF THE INVENTION

The present invention comprises a method of depositing a uniform thin film on a substrate using laser ablation of a target material. A laser beam is focused to strike the target and produce a plume of ablated material in a deposition chamber. Typically, the laser beam, which may be pulsed, is focused to strike the target along a line to produce a broad plume of ablated material expanding in a propagation direction outward from the target. The target may be formed in any of various shapes such as a rotating disk, a translating plate, or a rotating cylinder, for example.

In the thin film deposition method of the present invention, the plane of the substrate deposition surface is oriented generally parallel to the propagation direction of the expanding plume of ablated material. The deposition chamber includes a low background pressure of inert or reactive gas, depending on the material to be deposited, to facilitate lateral diffusion of ablated atoms, ions, and molecules to be deposited on the substrate surface. Particles ejected from the target material have trajectories generally parallel to the propagation direction of the plume but are too heavy to have significant lateral diffusion. Therefore, ejected particles have little chance of lodging on the deposition surface. The substrate may be rotated about an axis perpendicular to the deposition surface (and generally perpendicular to the propagation direction of the plume) to provide uniform deposition over the entire surface. The method may also be used to deposit thin films on both sides of a substrate simultaneously, and on multiple substrates by stacking them in space-apart orientation in the plume.

A principal object of the invention is the fabrication of high quality thin films that are uniform over a large area without particle inclusion. A feature of the invention is orientation of the thin film deposition surface generally parallel to the propagation direction of a plume of laser ablated material. An advantage of the invention is the use of a Pulsed Laser Deposition (PLD) process to fabricate high quality thin films for a variety of uses including optical applications.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

The present invention comprises a method of depositing a uniform thin film on a substrate by means of laser ablation of a target material. Laser ablation has been demonstrated to be an excellent technique for producing thin film such as simple oxides (e.g., ZnO, $Ga_2O_3$, MgO, $HfO_2$ etc.), complex oxides (e.g., ferroelectrics, high T superconductors, etc.), and other materials (e.g., amorphous, diamond-like carbon films). Compared with films grown by other methods, such as sputtering or vapor deposition, films produced by laser ablation are generally more stoichiometric and have better crystallinity. The process of laser ablation also has advantages such as use of small targets, multilayer heterostructure growth, and dopant introduction by means of plasma interaction.

Figure 1:
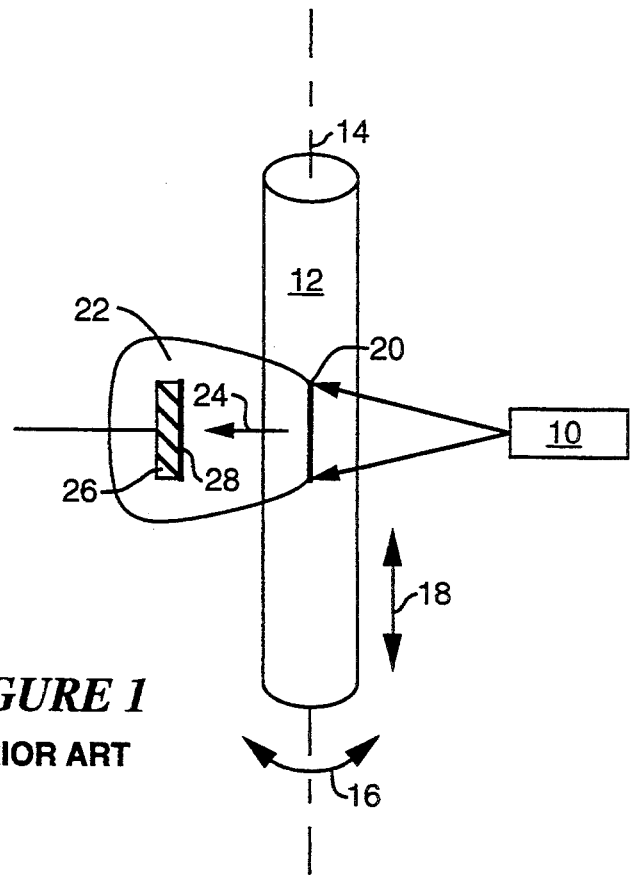
FIG. 1 is a schematic illustration of thin film deposition by laser ablation of a cylindrical target as is known in the prior art.
Figure 2:
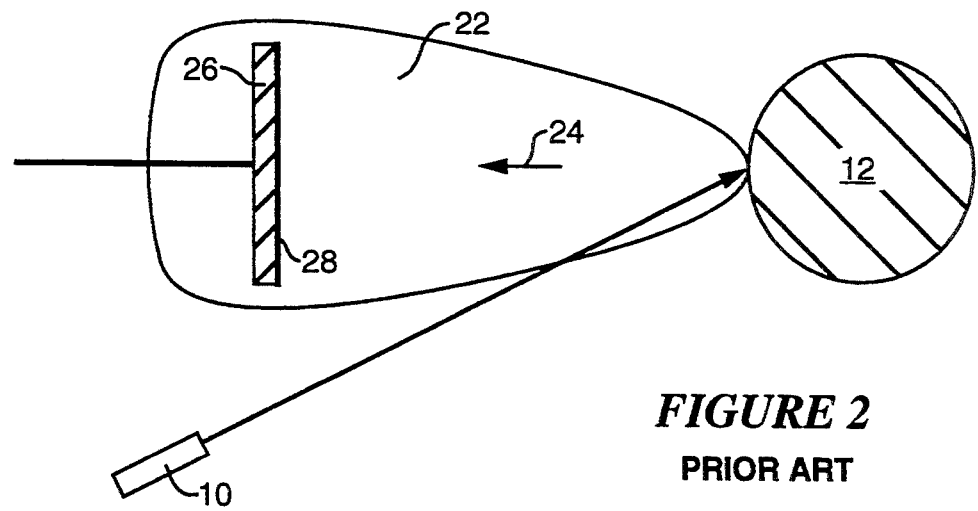
FIG. 2 is a schematic cross section of the prior art configuration illustrated in FIG. 1.

The process of thin film deposition by laser ablation as it is known in the art is illustrated schematically in FIG. 1 and in FIG. 2 which shows a cross section of the configuration of FIG. 1. A laser 10 generates a beam focused on a target 12 of ablative material. In FIG. 1, target 12 is shown in a preferred, cylindrical embodiment that may be rotated about its axis 14 as indicated by arrows 16, and translated along axis 14 as indicated by arrows 18. Target 12 may comprise any of various other shapes such as a rotating disk or a translating plate, for example. Typically, laser 10 is focused on target 12 along a line 20 to produce a fan-like plume 22 of ablated material that emanates from target 12 and propagates outwardly in the general direction indicated by arrow 24. A substrate 26 is placed within plume 22 of ablated material so that a deposition surface 28 of target 26 is oriented generally perpendicular to the propagation direction 24 of plume 22. Laser 10 is normally pulsed at a rate to provide optimum energy for vaporizing the material of target 12. Thus, this process has become known as Pulsed Laser Deposition, or PLD.

The ablation plume 22 produced by PLD is a result of adiabatic jet expansion and is not Lambertian (i.e., it is not a Cos Θ distribution). The angular distribution of PLD ablation plumes follows a $Cos^n Θ$ law, where n can vary from about 2 to 11. This narrow angular distribution and the close target-to-substrate distance results in poor thickness uniformity of the deposited film on surface 28 even when using techniques such as wobbling the target mount, skimming the plume with an aperture, or rastering the laser beam over the target. These techniques, while helpful, do not produce films having the desired uniformity over a large area and do not exploit some of the advantages of the PLD process.

In addition to the lack of large area uniformity, prior art PLD suffers from particle inclusion caused by splashing. The intense interaction between the laser beam and target 12 produces phenomena, such as exfoliation, subsurface boiling, and surface molten layer repulsion by laser induced shock wave, which eject particles that become lodged on deposition surface 28. As explained above, the inclusion of particles in thin films precludes the use of PLD for fabricating many electronic and optical devices.

Figure 3:
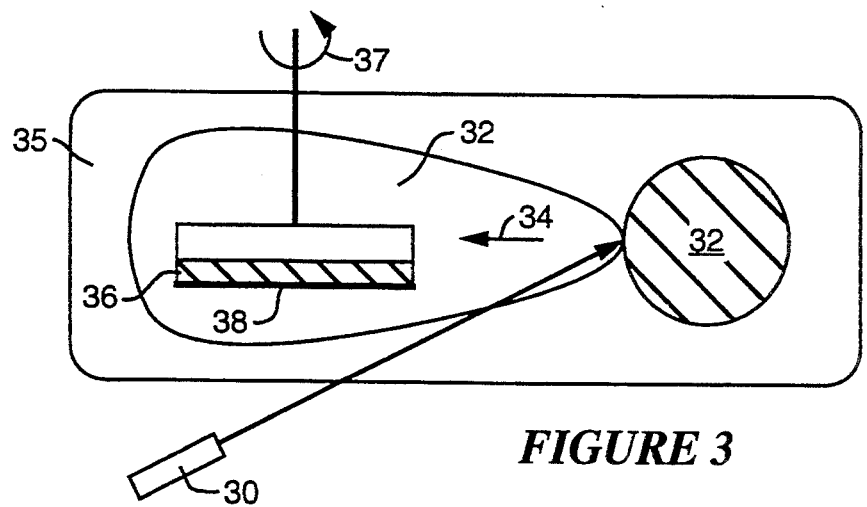
FIG. 3 is a schematic cross section illustrating a substrate deposition surface oriented in a plume of ablated material in accordance with the present invention.

The general method of the present invention is illustrated in schematic cross section in FIG. 3. A laser 30 focuses a beam on a target 32, preferably along a line on a rotatable cylinder as shown in FIG. 1. The laser beam produces a plume 32 of ablated material extending outward from target 32 in the general propagation direction indicated by arrow 34 within a deposition chamber 35. Deposition chamber 35, which includes a window for transmitting the laser beam, contains a reactive gas (such as oxygen for depositing oxides, or nitrogen or ammonia for depositing nitrides, for example) or an inert gas (such as argon or neon for depositing other materials) at a low pressure in the range of approximately $5 \times 10^{-1}$ to $10^{-3}$ torr. In the presence of the low pressure background gas, plume 32 of laser ablated material is a hydrodynamic flow.

A substrate 36 having a deposition surface 38 is placed in plume 32 as illustrated in FIG. 3. Deposition surface 38 is oriented generally parallel to the propagation direction 34 of plume 32 of ablated material. In the preferred embodiment of the process (in which laser 10 is focused along line 20 on rotating-translating rod 12 as shown in FIG. 1), substrate 36 is mounted with surface 38 generally parallel to a plane normal to the surface of target 32 along the focus line of laser 30. Plume 32 comprises atoms, ions, and molecules of laser ablated material, which have collisions with the background gas and are light enough to have lateral diffusion sufficient for depositing on surface 38. Particles ejected from target 32 have trajectories generally in the propagation direction 34 and are too heavy to have any effective lateral diffusion. Therefore, particles ejected from target 32 have no tendency to become deposited or lodged on deposition surface 38. For the least likelihood of particle inclusion, surface 38 can be oriented (as illustrated in FIG. 3) to face away from the centerline of plume 32 (as designated by arrow 34) so that surface 38 is not in direct line-of-sight with the area (line) of laser ablation of target 32. Large area uniformity of thin film deposition on surface 38 is achieved by rotating substrate 36, as indicated by arrow 37, about an axis perpendicular to surface 38 and generally perpendicular to the propagation direction 34 of plume 32.

Figure 4:
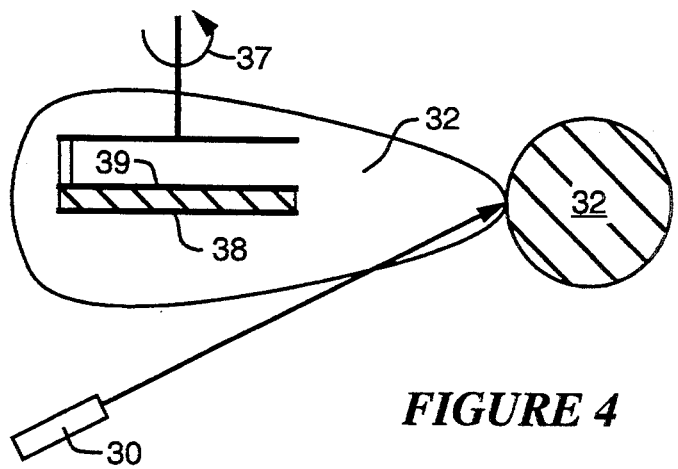
FIG. 4 is a schematic cross section similar to FIG. 3 but illustrating thin film deposition on both surfaces of a substrate.
Figure 5:
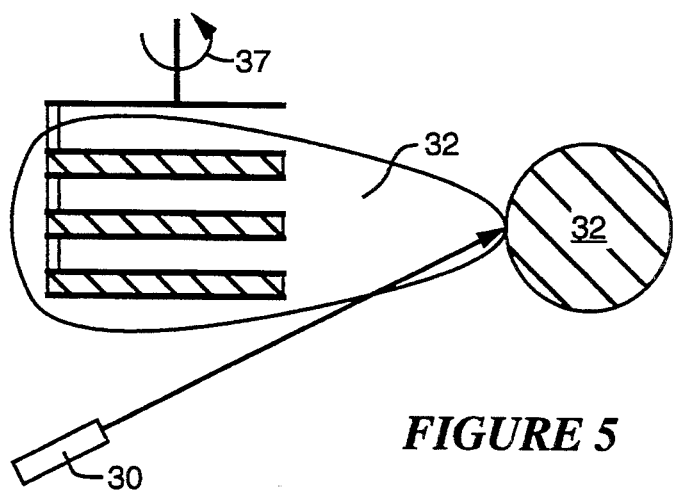
FIG. 5 is a schematic cross section similar to FIG. 3 but illustrating thin film deposition on multiple substrates stacked in space-apart orientation.

In a variation of the basic method of the present invention, substrate 36 can be mounted and oriented in plume 32, as shown in FIG. 4, so as to deposit a thin film on both sides 38 and 39 of substrate 36 simultaneously. In this embodiment, substrate 36 can be mounted for rotation at its axis, offset front its axis, or at its edge (as shown in FIG. 4). In a further variation of the process, a stack of spaced-apart substrate wafers can be mounted and oriented in plume 32 (with spacing much larger than the mean free path in the plume), as illustrated in FIG. 5, for simultaneous deposition of thin films on one or both sides of each wafer.

Although the present process is similar in some respects to low pressure plasma chemical vapor deposition, it is more flexible and applicable to a wider range of materials. The deposition chamber 35 used for initial experiments with 3-inch wafers had a diameter of only six inches. By increasing the size of the chamber and operating at higher laser power to produce longer ablation plumes, uniform film growth can be extended to even larger wafers (with rotation it is not necessary that a wafer extend entirely within plume 32 as illustrated in the Figures). The process has been reduced to practice by depositing ZnO films by Kr:F laser ablation operated at 15 Hz to produce a growth rate of about 1.5 Å/sec., which is adequate for many applications. Higher deposition rates are achievable with commercially available Excimer lasers having a repetition rate of 200 Hz. Conventional pulsed laser deposition processes use Excimer lasers because they produces less splashing and fewer splashed particles compared to alternative lasers. However, with the method of the present invention, it is possible to replace Excimer lasers with TEA CO2 or Pockel cell Q-switched Nd:YAG lasers, which are more reliable and have much lower operating costs than Excimer lasers.

Thin ZnO films produced using the present method have thickness variations less than 10% over a 3-inch diameter area without particle inclusion. The films are stoichiometric, well oriented with good crystallinity, and optically very transparent. The process is believed to be useful for depositing thin films such as: ZnO for heterostructure thin film sensors, piezoelectric devices, resonators, and filters; indium-tin-oxides for conductive transparent electrodes; $Ta_2O_3$ and other oxides for high dielectric thin film capacitors; low power, thin film ferroelectric devices; high $T_c$ superconductors; high damage threshold laser mirror coatings; and amorphous, diamond-like carbon films for diamond field emitter devices, for example.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

I claim:

1. A method of thin film deposition by laser ablation, comprising the steps of:
   providing a deposition chamber containing a background gas;
   providing a target of laser ablative material within said chamber;
   focusing a laser beam on said target to form a plume including atoms, ions, molecules, and particulates of ablated material extending in a propagation direction outward form said target in said chamber;
   providing said background gas at a low pressure sufficient to cause lateral diffusion of said atoms, ions, and molecules of said ablated material within said plume;
   placing a substrate having a deposition surface at least partially within said plume of ablated material;
   orienting said deposition surface generally parallel to said propagation direction of said plume of ablated material and not in direct line-of-sight with said focus of said laser beam on said target; and
   depositing said ablated material other than said particulates on said deposition surface.

2. The method of claim 1, further comprising the step of rotating said deposition surface about an axis generally perpendicular to said propagation direction of said plume of ablated material.

3. The method of claim 1, wherein the focusing step comprises focusing said laser beam along a line on said target.

4. The method of claim 1, further comprising the step of placing said substrate with two deposition surfaces at least partially within said plume of ablated material and orienting both of said deposition surfaces generally parallel to said propagation direction of said plume and not in direct line-of-sight with said focus of said laser beam on said target.

5. The method of claim 1, further comprising the step of placing a plurality of spaced-apart substrates having deposition surfaces at least partially within said plume of ablated material and orienting said deposition surfaces of said plurality of substrates generally parallel to said propagation direction of said plume and not in direct line-of-sight with said focus of said laser beam on said target.

6. The method of claim 1, wherein the step of providing said background gas in said deposition chamber comprises providing a reactive gas for chemically reacting with said ablated material.

7. The method of claim 6, wherein the step of providing said reactive gas in said deposition chamber comprises providing oxygen for chemically reacting with said ablated material for depositing an oxide film on said deposition surface.

8. A method of thin film deposition by laser ablation, comprising the steps of:
   providing a deposition chamber containing a background gas;
   providing a target of laser ablative material within said chamber;
   focusing a laser beam along a line on said target to form a plume including atoms, ions, molecules, and particulates of ablated material extending in a propagation direction outward from said target in said chamber;
   providing said background gas at a low pressure sufficient to cause lateral diffusion of said atoms, ions, and molecules of said ablated material within said plume;
   placing a substrate having a deposition surface at least partially within said plume of ablated material;
   orienting said deposition surface generally parallel to said propagation direction of said plume of ablated material and not in direct line-of-sight with said focus of said laser beam on said target;
   rotating said deposition surface about an axis perpendicular to said deposition surface; and
   depositing said ablated material other than said particulates on said rotating deposition surface.

9. The method of claim 8, wherein the step of providing said deposition chamber containing said background gas comprises providing said background gas at a pressure in the range of approximately $5 \times 10^{-1}$ to $10^{-3}$ torr.

10. The method of claim 8, further comprising the step of placing said substrate with two deposition surfaces at least partially within said plume of ablated material and orienting both of said deposition surfaces generally parallel to said propagation direction of said plume and not in direct line-of-sight with said focus of said laser beam on said target.

11. The method of claim 8, further comprising the step of placing a plurality of spaced-apart substrates having deposition surfaces at least partially within said plume of ablated material and orienting said deposition surfaces of said plurality of substrates generally parallel to said propagation direction of said plume and not in direct line-of-sight with said focus of said laser beam on said target.

12. The method of claim 8, wherein the step of providing said background gas in said deposition chamber comprises providing a reactive gas for chemically reacting with said ablated material.

13. The method of claim 12, wherein the step of providing said reactive gas in said deposition chamber comprises providing oxygen for chemically reacting with said ablated material for depositing an oxide film on said deposition surface.

14. A method of depositing a thin film on a substrate by pulsed laser ablation of a target of ablative material, comprising the steps of:
 providing a deposition chamber containing a background gas;
 placing the target of laser ablative material within said chamber;
 focusing a pulsed laser beam along a line on said target to form a plume including atoms, ions, molecules, and particulates of ablated material extending in a propagation direction outward from said target in said chamber;
 providing said background gas at a low pressure sufficient to cause lateral diffusion of said atoms, ions, and molecules of said ablated material within said plume;
 placing a deposition surface of a substrate within said plume of ablated material;
 orienting said deposition surface on or generally parallel to a plane normal to said target and not in direct line-of-sight with said line of focus of said laser beam on said target;
 rotating said deposition surface about an axis perpendicular to said deposition surface; and
 depositing said ablated material other than said particulates on said rotating deposition surface.

15. The method of claim 14, wherein the step of providing said deposition chamber containing said background gas comprises providing said background gas at a pressure in the range of approximately $5 \times 10^{-1}$ to $10^{-3}$ torr.

16. The method of claim 15, further comprising the step of placing said substrate with two deposition surfaces at least partially within said plume of ablated material and orienting both of said deposition surfaces generally parallel to said direction of said plume and not in direct line-of-sight with said focus of said laser beam on said target.

17. The method of claim 15, further comprising the step of placing a plurality of spaced-apart substrates having deposition surfaces at least partially within said plume of ablated material and orienting said deposition surfaces of said plurality of substrates generally parallel to said direction of said plume and not in direct line-of-sight with said focus of said laser beam on said target.

18. The method of claim 15, wherein the step of providing said background gas in said deposition chamber comprises providing a reactive gas for chemically reacting with said ablated material.

19. The method of claim 18, wherein the step of providing said reactive gas in said deposition chamber comprises providing oxygen for chemically reacting with said ablated material for depositing an oxide film on said deposition surface.

20. The method of claim 18, wherein the step of providing said reactive gas in said deposition chamber comprises providing a gas containing nitrogen for chemically reacting with said ablated material for depositing a nitride film on said deposition surface.

* * * * *